United States Patent [19]
Pawlowski

[11] Patent Number: 6,031,770
[45] Date of Patent: Feb. 29, 2000

[54] SYNCHRONOUS MEMORY WITH PROGRAMMABLE READ LATENCY

[75] Inventor: J. Thomas Pawlowski, Boise, Id.

[73] Assignee: Micron Technology, Inc., Boise, Id.

[21] Appl. No.: 09/225,939

[22] Filed: Jan. 6, 1999

Related U.S. Application Data

[62] Division of application No. 08/916,584, Aug. 22, 1997.

[51] Int. Cl.[7] .................................................. G11C 16/04
[52] U.S. Cl. ...................... 365/194; 365/189.05; 365/233
[58] Field of Search ............................... 365/189.01, 194, 365/189.05, 233, 191

[56] References Cited

U.S. PATENT DOCUMENTS 4,445,204  4/1984  Nishiguchi .............................. 365/194
5,311,483  5/1994  Takasugi .................................. 365/233
5,729,502  3/1998  Furutani et al. ......................... 365/233

*Primary Examiner*—David Nelms
*Assistant Examiner*—Hoai V. Ho
*Attorney, Agent, or Firm*—Kirkpatrick & Lockhart LLP

[57] ABSTRACT

The present invention is directed to a logic circuit for controlling the read latency time of a memory circuit. The logic circuit includes a first circuit for producing a plurality of values derived from a read enable signal. Each of the values represents the read enable signal delayed by a predetermined period of time. The logic circuit also includes a second circuit for selecting one of the plurality of values in response to at least one control signal. The selected value enables a read operation of the memory circuit. A method for controlling the read latency time of a memory circuit is also presented.

20 Claims, 4 Drawing Sheets

SYNCHRONOUS MEMORY WITH PROGRAMMABLE READ LATENCY

CROSS REFERENCE TO RELATED APPLICATIONS

This is a divisional of copending U.S. patent application Ser. No. 08/916,584, filed on Aug. 22, 1997.

STATEMENT REGARDING FEDERALLY SPONSORED RESEARCH (Not Applicable)

BACKGROUND OF THE INVENTION

1. Field of the Invention

The present invention is directed generally to memory circuits, and, more particularly, to a synchronous memory circuit with programmable read latency.

2. Description of the Background

Cache memories are used in computer systems to reduce the time required by a processor to access data that is stored in the main memory device of the computer system. Cache memories are usually placed between the processor and the main memory. Blocks of data (cache lines) from the slower main memory of the computer system are stored in duplicate in the higher-speed cache memory. A request for data is first presented to the cache memory. If the data is not stored in the cache memory, the request is presented to the main memory.

When a request for data is presented to a cache memory and the data is not stored in the cache, the failed access is termed a "cache miss". Because the access times of main memory devices are generally anywhere from four to twenty times longer than the access times of cache memories, it is important that the frequency of cache misses be minimized. One way to accomplish this is to increase the size of the cache memory used in the computer system. Increasing the size of the cache allows for the storage of more duplicative data in the cache. Thus, the number of cache misses will be reduced.

Increasing the size of a cache decreases the cache performance due to the effect of, inter alia, parasitic capacitance. The performance of a cache memory is measured in latency time. Latency is the time that it takes for data to appear on the external data bus after an address is presented to the cache.

Many modern devices typically have a cache memory in communication with a processor. Data in the cache memory is organized in blocks (also known as lines) usually comprising a plurality of external bus widths of data. For example, a cache line may comprise 256 bits and the external data bus comprises 64 bits. A group of four bus transactions is required to operate on one full cache line. This is referred to as a burst length of four, the burst length being the number of external data bus transactions that occur for each address presented to the cache when a full line operation occurs. The processor operates at a particular frequency that may not be compatible with the latency of the cache. Thus, data that is read out of the cache memory may not be present on the data bus at the desired time. Also, the width of the external data bus that connects the processor to the cache may vary from the internal data width of the cache. The difference in data widths between the data bus and the cache may cause the cache to have a different burst length of data accesses than the processor, although the external data bus burst length is common between the cache and the processor. Thus, if the internal data width of the cache is two times the data width of the external data bus, there is an internal burst length of two for the external burst length of four. The extra burst pair is manifested in data multiplexing to the external data bus at a rate which can be twice as great as the internal data transaction rate.

If the microprocessor requires a burst length of one, for example, only one of the two fetches is allowed to complete or both fetches complete but only the desired result is output to the external data bus. Thus, it is desirable to have a cache memory that has an internal latency time that can be adjusted to operate in conjunction with processors that require a different burst length. It is also desirable to have a cache memory that has an internal latency time that can be adjusted to operate in conjunction with processors that have varying operating frequencies.

SUMMARY OF THE INVENTION

The present invention, according to its broadest implementation, is directed to a logic circuit and a method for controlling the read latency time of a memory circuit. The logic circuit and method produce a plurality of values derived from a read enable signal. Each value represents the read enable signal delayed by a predetermined period of time. One of the values is selected in response to at least one control signal to enable a read operation of the memory circuit.

The present invention contemplates, in combination, an output stage of a memory circuit and a control logic circuit for controlling the read latency time of the memory circuit.

The present invention also contemplates a memory circuit which comprises a memory array, write control and addressing logic connected to the memory array, sense amplifiers connected to the memory array, output registers connected to the sense amplifiers, and read output control logic responsive to a plurality of control signals for controlling the frequency of enablement of the output registers.

The present invention may also be part of a system, such as a cache memory system. The system may comprise a controlling device, a memory array, write control and addressing logic connected to the memory array, sense amplifiers connected to the memory array, output registers connected to the sense amplifiers, and read output control logic responsive to a plurality of control signals for controlling the frequency of enablement of the output registers.

The present invention represents a substantial advance over prior methods and circuits for controlling the read operations of memory circuits. Because the present invention allows for programmable memory circuit read latency times, the present invention permits the efficient integration and operation of memory circuits connected to controlling devices with incompatible operational speeds. Those, and other advantages and benefits of the present invention, will become apparent from the Detailed Description of the Invention hereinbelow.

BRIEF DESCRIPTION OF THE DRAWINGS

For the present invention to be clearly understood and readily practiced, the present invention will be described in conjunction with the following figures, wherein.

Figure 2:
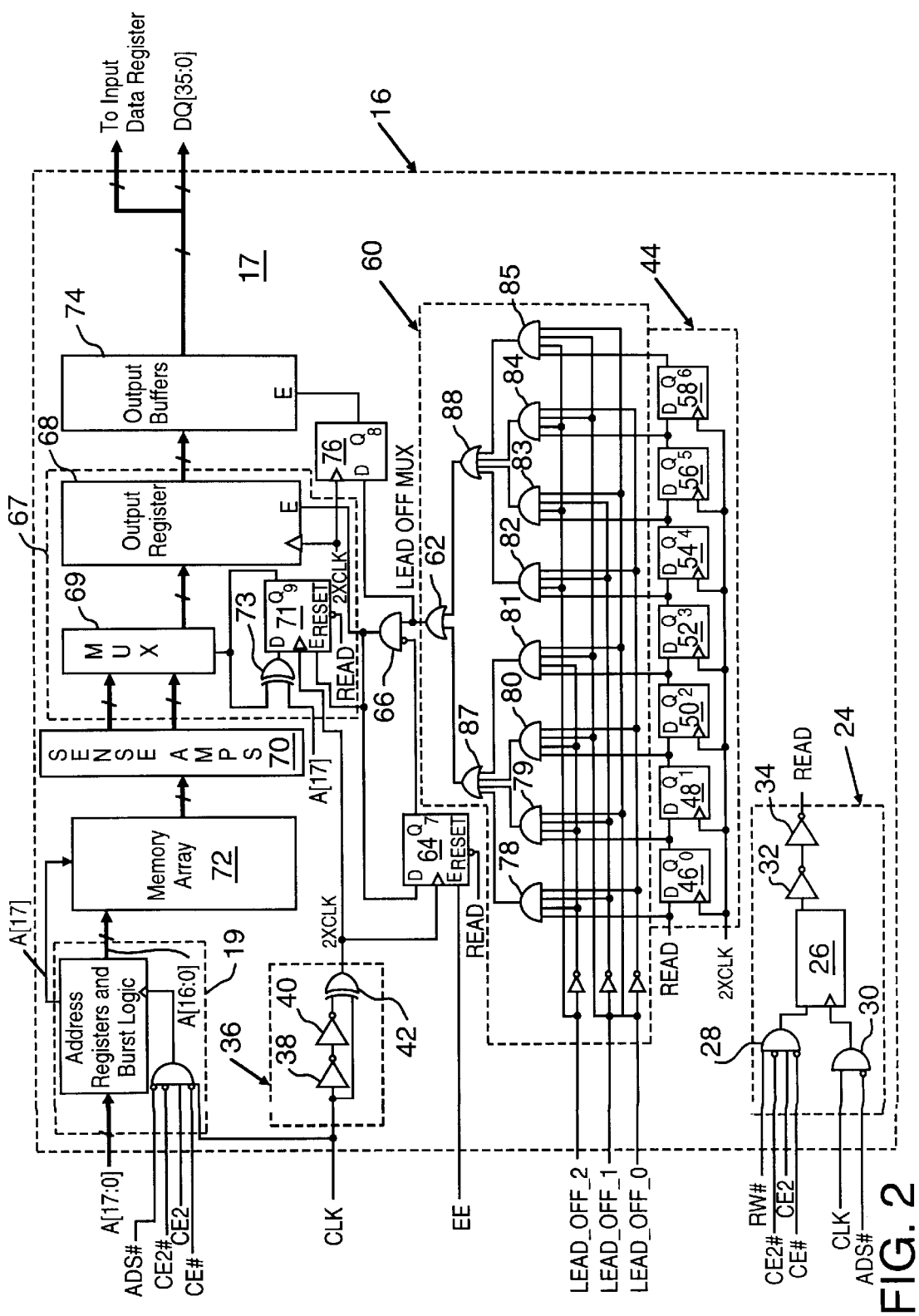
FIG. 2 is a schematic diagram illustrating relevant portions of one of the synchronous memory circuits of FIG. 1 having read output logic with variable latency according to the teachings of the present invention.
Figure 3:
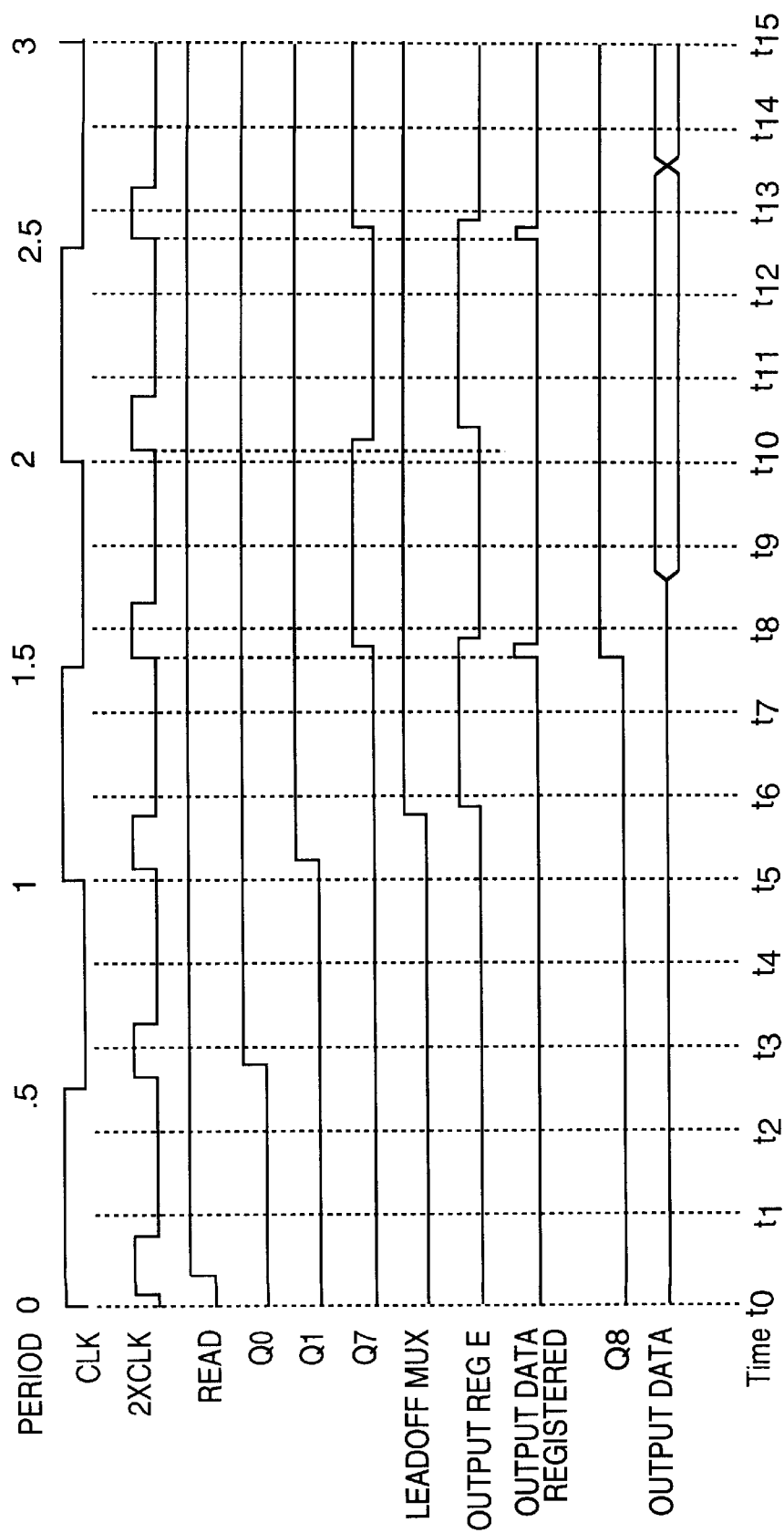
Figure 4:
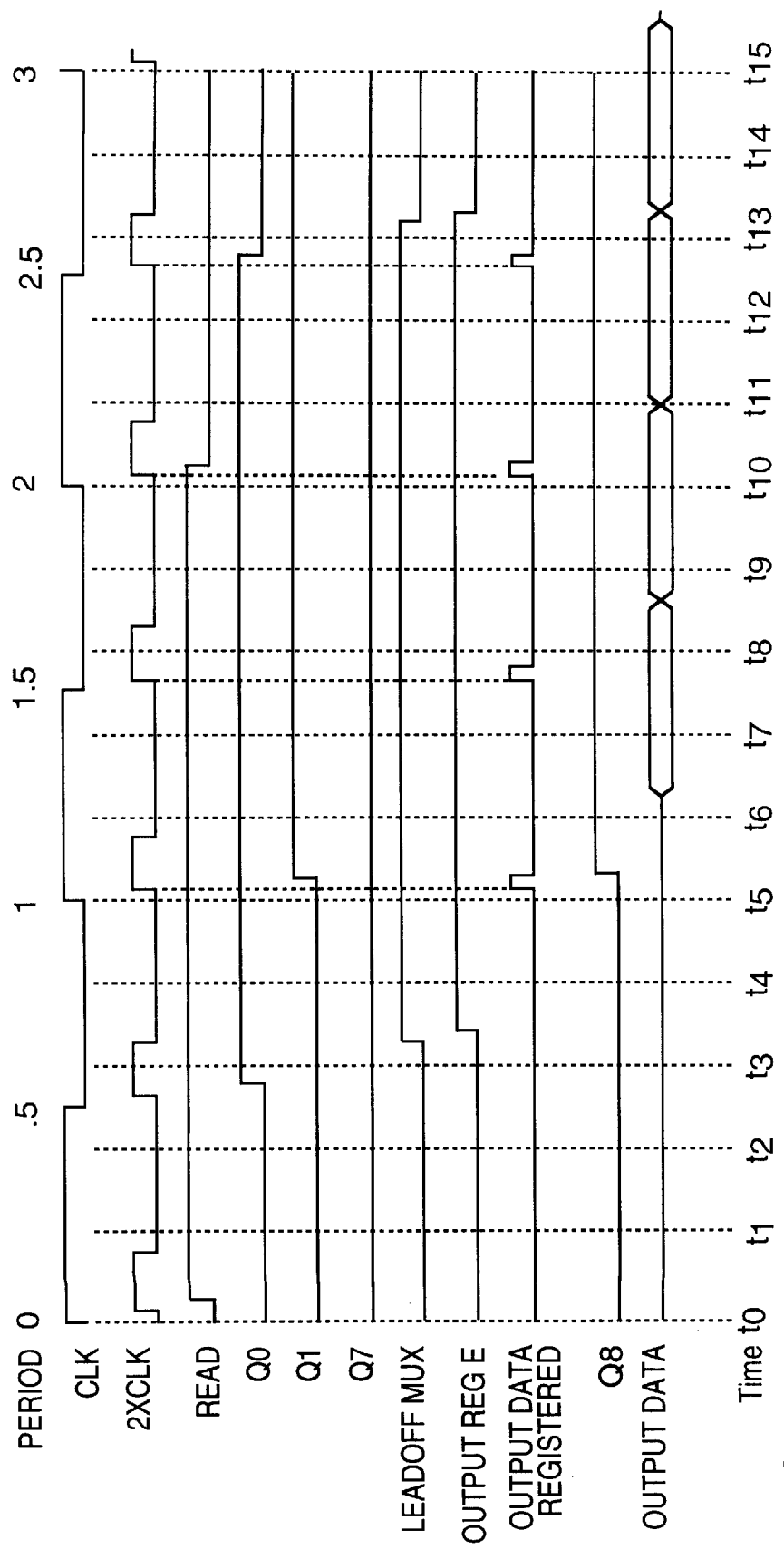

FIG. 3 is a timing diagram depicting the operation of the output logic of FIG. 2 with a 1.5 clock leadoff to registering data and data delivery once per clock period; and FIG. 4 is a timing diagram depicting the operation of the output logic of FIG. 2 with a 1 clock leadoff to registering data and data delivery twice per clock period.

DETAILED DESCRIPTION OF THE INVENTION

It is to be understood that the figures and descriptions of the invention have been simplified to illustrate elements that are relevant for a clear understanding of the present invention, while eliminating, for purposes of clarity, many other elements found in a typical memory system. Those of ordinary skill in the art will recognize that other elements are desirable and/or required to implement the present invention. However, because such elements are well known in the art, and because they do not facilitate a better understanding of the present invention, a discussion of such elements is not provided herein.

As used and described herein, a signal followed by a pound sign ("#") indicates that the signal is a logical complement of a signal having the same designation but without the pound sign, e.g., CE2# is the logical complement of CE2. Similarly, input and output terminal designations that are followed by a pound sign are active low inputs and outputs, e.g., chip enable terminal CE#2 is active low, meaning that the chip is enabled when a logic low state signal is present at terminal CE2#, assuming that all other conditions for enablement are also met.

Figure 1:
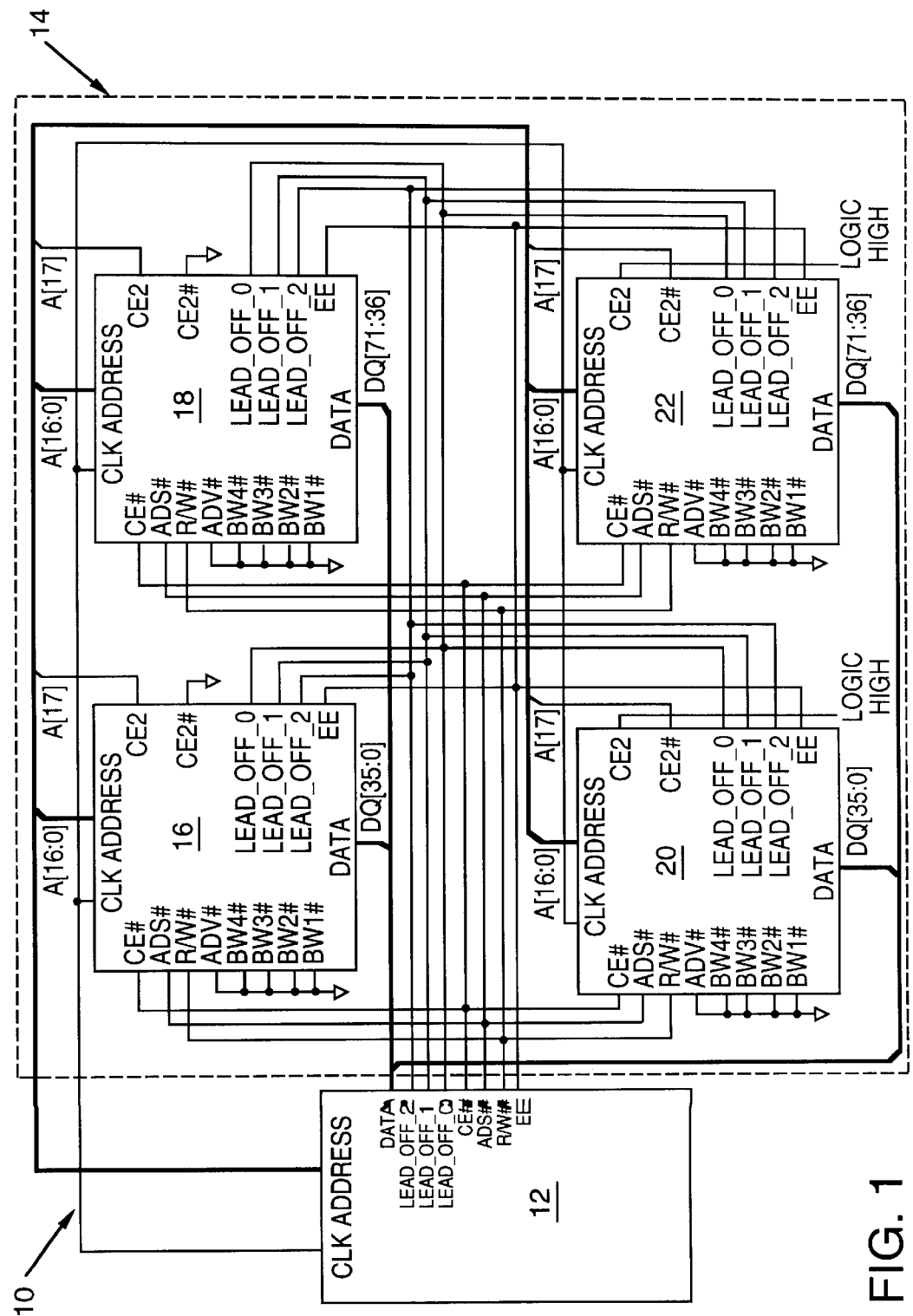
FIG. 1 is a circuit schematic of a cache memory constructed of sychronous memories each constructed according to a preferred embodiment of the present invention.

FIG. 1 shows a memory system 10 constructed in accordance with the present invention. The memory system 10 preferably includes a controlling device 12 and a cache memory device 14. The cache memory device 14, in the embodiment shown, is comprised of four static random access memory (SRAM) circuits 16, 18, 20, and 22. The controlling device 12 may be any type of controlling device known in the art, such as an application specific integrated circuit (ASIC) or a microprocessor, such as a Pentium® processor manufactured by Intel Corp., Santa Clara, Calif. It can be understood by those skilled in the art that a cache control logic (CCL) device, which is typically an ASIC, may be used in conjunction with the memory system 10 to act as an interface between the controlling device 12 and the cache memory device 14. The CCL may generate some of the control signals that are described hereinbelow as being generated by the controlling device 12.

Although the present invention may be used in any type of memory system or circuit, it is preferably embodied in cache memory because the present invention is directed at controlling the latency of a memory device, which is generally more important with cache memory than with other types of memory. The memory circuits 16, 18, 20, 22 are preferably SRAMs, although other embodiments, such as synchronous dynamic random access memories (DRAMs), electronically erasable programmable read only memories (EEPROM), flash EEPROM, and read only memories (ROMs) may also be used with the present invention. The memory circuits 16, 18, 20, 22 may be fabricated using any one of many different technologies, including silicon-on-insulator technology, silicon-on-sapphire technology, and thin film transistor technology. The preferred embodiment of the present invention is fabricated on a silicon substrate using a conventional doping technology.

The memory circuits 16, 18, 20, 22 of FIG. 1 are, for example, 128K×36 SRAMs. When connected to form the cache memory device 14, the result is a cache memory that is 256K×72. The address signals on lines A[17:0] generated by the controlling device 12 specify the memory cells whose contents will be either read out onto data lines DQ [71:0], or written into from data signals on lines DQ[71:0 ]. The memory circuits 16, 18, 20, 22 each receive three chip enable signals at chip enable terminals CE#, CE2#, and CE2. Chip enable terminal CE#, which responds to the CE# signal from the controlling device 12, is used to disable the memory circuits 16, 18, 20, 22 to prevent read and write operations, prevent new addresses from being accessed within the memory circuits 16, 18, 20, 22, and to block address interrupt signals. The CE# terminal may also be used to selectively disable the memory circuits 16, 18, 20, 22, for example, to conserve power during periods of non-use.

The CE2 and CE2# terminals of the memory circuits 16, 18, 20, 22 are used, in the embodiment shown, to mutually exclusively enable either memory circuits 16 and 18 or memory circuits 20 and 22. The most significant bit A[17] of the address generated by the controlling device 12 is connected to the CE2 terminals of the memory circuits 16, 18 and the CE2# terminals of the memory circuits 16, 18 are connected to ground. Thus, if bit A[17] is in a logic high state, the memory circuits 16 and 18 will be enabled. The most significant bit A[17] of the address generated by the controlling device 12 is connected to the CE2# terminals of the memory circuits 20, 22 and the CE2 terminals of the memory circuits 20, 22 are connected to a logic high state. Thus, if bit A[17] is in a logic low state, the memory circuits 20 and 22 will be enabled. It can be understood by those skilled in the art that if additional memory circuits are added to the memory system 10, terminal CE2# may be used to selectively control those additional memory circuits in a manner similar to that implemented with terminals CE# and CE2.

A clock in the controlling device 12 generates a clock signal (CLK) that is used for timing in the memory system 10. The controlling device 12 also generates the every edge signal. (EE). The EE signal enables or disables circuitry, for example phase-locked loop circuitry, in the memory circuits 16, 18, 20, 22 that allow the memory circuits 16, 18, 20, 22 to operate at both the rising and falling edge transitions of the CLK signal or to operate at only either the rising edge or the falling edge transitions of the CLK signal. Thus, if the signal EE is active, the clock frequency is roughly doubled.

The read/write signal (R/W#), which is connected to the R/W# terminals of the memory circuits 16, 18, 20, 22, is generated by the controlling device 12 to signal to the memory circuits 16, 18, 20, 22 whether a desired memory operation is a read or a write. A logic high state on the R/W# signal indicates that the desired operation is a read operation and a logic low state on the R/W# signal indicates that the desired operation is a write operation.

The byte write terminals BW1#, BW2#, BW3#, and BW4# of the memory circuits 16, 18, 20, 22 are connected to a logic low state, in the preferred embodiment shown in FIG. 1) However, it can be understood by those skilled in the art that BW1#, BW2#, BW3#, and BW4# may be used in other embodiments to enable write drivers in the memory circuits 16, 18, 20, 22, which could be in the write control circuitry of the memory circuits 16, 18, 20, 22. The advance terminal (ADV#) is also connected to a logic low state in the preferred embodiment shown in FIG. 1. However, it can be understood by those skilled in the art that ADV# may be used in other embodiments to signal the burst logic block circuitry in the memory circuits 16, 18, 20, 22 to advance the address that is presented to the memory circuits 16, 18, 20, 22.

The address status signal (ADS#), which is generated by the controlling device 12, is connected to the ADS# terminals of the memory circuits 16, 18, 20, 22. ADS# is an address input enable signal which indicates that a new memory location is to be addressed in the appropriately enabled circuits 16, 18, 20, 22, and a new R/W# command is accepted. ADS# also prevents all read and write access to the memory circuits 16, 18, 20, 22 other than the previously requested memory location, until a new memory location is requested (using an address and R/W#). ADS# also prevents all read and write access to the memory circuits 16, 18, 20, 22 until a new memory location is addressed.

The lead-off signals (LEAD_OFF_0, LEAD_OFF_1, LEAD_OFF_2), which are generated by the controlling device 12, are connected to the LEAD_OFF_0, LEAD_OFF_1, and LEAD_OFF_2 terminals of the memory circuits 16, 18, 20, 22. The lead-off signals are used to select the latency period of the cache memory device 14. It can be understood by those skilled in the art that the LEAD_OFF_0, LEAD_OFF_1, and LEAD_OFF_2 terminals on the memory circuits 16, 18, 20, 22 can be strapped to any logical combinations of logic high and logic low values if a fixed latency, rather than a programmable variable latency, is desired. The operation of the lead-off signals is described hereinbelow in conjunction with FIG. 2.

FIG. 2 illustrates one of the synchronous memory circuits 16 of FIG. 1 having read output control logic 17 constructed according to a preferred embodiment of the present invention. The read output control logic 17 operates in conjunction with sense amps 70, output register circuit 67 and output buffers 74 to output or read data from the memory array 72. The logic shown in FIG. 2 is a partial representation of the logic of the memory circuit 16. The logic depicted is the logic that is necessary for an understanding of the present invention. Details of other logic, such as address registers and burst logic 19, have been omitted from FIG. 2 to simplify the present invention. It can be understood by those skilled in the art that the read output control logic 17 will work with many different types of internal logic that are typically present in the memory circuit 16. In the preferred embodiment of the present invention shown in FIG. 1, the read output control logic 17 of the memory circuits 16, 18, 20, 22 is identical to the logic 17 illustrated for the memory circuit 16 in FIG. 2.

A read signal generation circuit 24 generates an internal read signal READ. The data input of read register 26 is attached to a logic high state when the chip enable signals CE#, CE2#, and CE2 are active and R/W# is at a logic high state, which generates a logic high value at the output of AND gate 28. The read register 26 is clocked when CLK is active and the address status signal (ADS#) is active, which generates a logic high value at the output of AND gate 30. The output of the read register 26 is delayed by buffers 32 and 34. The output of the buffer 34 is the READ signal.

Clock generation circuit 36 generates signal 2XCLK, which is a clock pulse signal that transitions at twice the frequency of the CLK signal. The CLK signal is delayed by buffers 38 and 40 and is exclusive ORed by XOR gate 42. The output of the XOR gate 42, 2XCLK, thus provides a rising edge transition at roughly the rising edge and the falling edge transitions of the CLK signal.

The READ signal and the 2XCLK signal are input to a serial register 44 which operates as a delay circuit. The serial register 44 is comprised of flip flops 46, 48, 50, 52, 54, 56, and 58. Each clock pulse shifts the contents of the register 44 one bit to the right. The READ signal is shifted through the flip flops 46, 48, 50, 52, 54, 56, 58 at every leading and trailing edge of the CLK signal. The output terminals Q0 through Q6 of each of the flip flops 46, 48, 50, 52, 54, 56, 58 represent the value of the READ signal at successive pulses of the 2XLK signal. Thus, the signals available at the output terminals Q0 through Q6 of each of the flip flops 46, 48, 50, 52, 54, 56, 58 are representative of the read enable signal delayed by a predetermined period of time.

The output terminals Q0 through Q6 and the READ signal are input to a leadoff multiplexer 60. Lead-off signals LEAD_OFF_0, LEAD_OFF_1, and LEAD_OFF_2 select one of either the READ signal (input to the flip flop 46), or one of the values of the read signal present at the output terminals Q0 through Q6 of the flip flops 46, 48, 50, 52, 54, 56, 58. That is accomplished through the use of a plurality of AND gates, each having four input terminals connected as follows:

AND gate 78 receives the READ signal and the inverse of the LEAD_OFF_0, LEAD_OFF_1, and LEAD_OFF_2 signals;

AND gate 79 receives the output signal at Q0, the LEAD_OFF_0 signal, and the inverse of the LEAD_OFF_1 and LEAD_OFF_2 signals;

AND gate 80 receives the output signal at Q1, the inverse of the LEAD_OFF_0 signal, the LEAD_OFF_1 signal, and the inverse of LEAD_OFF_2 signal;

AND gate 81 receives the output signal at Q2, the LEAD_OFF_0 signal, the LEAD_OFF_1 signal, and the inverse of the LEAD_OFF_2 signal;

AND gate 82 receives the output signal at Q3, the LEAD_OFF_2 signal, the inverse of the LEAD_OFF_1, signal, and the inverse of the LFAD_OFF_0 signal;

AND gate 83 receives the output signal at Q4, the LEAD_OFF_2 signal, the inverse of the LEAD_OFF_1 signal, and the LEAD_OFF_0 signal;

AND gate 84 receives the output signal at Q5, the LEAD_OFF_2 signal, the LEAD_OFF_1 signal, and the inverse of the LEAD_OFF_0 signal;

AND gate 85 receives the output signal at Q6, the LEAD_OFF_2 signal, the LEAD_OFF_1 signal, and the LEAD_OFF_0 signal.

The outputs of the AND gates 78–81 are connected to an OR gate 87 and the outputs of the AND gates 82–85 are connected to an OR gate 88. The outputs of the OR gates 87, 88 are connected to an OR gate 62. A signal LEADOFF MUX is available at an output terminal of OR gate 62.

The AND gates 78–85 are connected such that only one receives logic high signals at three of its input terminals, by virtue of the values of the LEAD_OFF_0 signal, the LEAD_OFF_1 signal, and the LEAD_OFF_2 signal. The AND gate 78–85 which receives logic high signals at three of its input terminals conducts the value of the READ signal available at its fourth input terminal. Because each AND gate 78–85 receives a value of the READ signal delayed by a different amount of time, the amount of delay can be programmed through proper selection of the values of the signals LEAD_OFF_0, LEAD_OFF_1, and LEAD_OFF_2.

The signal LEADOFF MUX represents the value of the READ signal that is delayed by 0.5 periods of the CLK signal by operation of the buffers 32 and 34 and from 0 to 3.5 periods of the CLK signal by the serial register 44. Thus, in the preferred embodiment shown if FIG. 2, the LEAD-OFF MUX signal is delayed by from 0.5 to 4.0 periods of the CLK signal.

An every-edge register 64 controls whether the memory circuit 16 operates on every transition edge of the CLK signal or whether the memory circuit 16 operates on a single edge of the CLK signal. The every edge signal (EE), when at a logic high state, disables the register 64. The disablement causes a logic low state to be present at the inverted input of an AND gate 66. Thus, when the EE signal is at a logic high state, the register 64 has no effect on the operation of the memory circuit 16; the memory circuit 16 enables output registers 68 when the LEADOFF MUX signal is at a logic high state and the results of the output registers 68 are propagated in response to the 2XCLK signal. When the EE signal is at a logic low state, the register 64 is enabled. When the LEADOFF MUX signal transitions from a logic low state to a logic high state, the output registers 68 in the output register circuit 67 are enabled, and the contents of the registers, which were previously sensed by sense amplifiers 70 from the addressed contents of memory array 72, are clocked into the output registers 68 on the subsequent transition of the 2XCLK signal. A transition of the 2XCLK signal causes a logic high state (the output of the AND gate 66 to be latched into the register 64 and to propagate to the AND gate 66, and thus cause the output of the AND gate 66 to transition a logic low state. The output buffers 74 will be disabled, and a subsequent transition of the 2XCLK signal will not propagate the results from the output registers 68 to output buffers 74. Thus, the contents of the output registers 68 will be propagated to the output buffers 74 only on one transition edge of the CLK signal (every two 2XCLK signal transition edges).

The output register circuit 67 includes the output registers 68, a multiplexer 69, a register 71, and an XOR gate 73. The output of the memory array 72 has a data width twice that of the output of the memory circuit 16. The multiplexer 69 selects one-half of the data width from the sense amplifiers 70. The output Q9 of the register 71 is used to select the half of the data that is desired. The output of the XOR gate 73, which has as its inputs the most significant bit of the address, A[17], and the output Q9 of the register 71. Thus, if A[17] is at a logic high state, a first half of the data will be selected. If A[17] is at a logic low state, a second half of the data will be selected.

A buffer enable register 76 receives the LEADOFF MUX signal at its data input terminal D. The LEADOFF MUX signal is clocked into the register 76 on the same signal transition of the 2XCLK signal as, the transition that shifts the contents of the output registers 68 to the output buffers 74. The subsequent transition of the 2XCLK signal will latch the LEADOFF MUX signal into the register 76, and thus the output buffers 74 will be enabled and the data signals DQ[35:0] will appear on the memory system external data bus.

The internal latency of the memory circuit 16, measured by the number of clocks that are needed to latch the desired contents of the memory array 72 into the output registers 68, can be programmed by inputting any of 8 combinations of logic values to the leadoff multiplexer 60 via the LEAD_OFF_0, LEAD_OFF_1, and LEAD_OFF_2 signals, to be from 0.5 to 4 periods of the CLK signal. The external latency, measured by the number of clocks that are needed to propagate the desired contents of the memory array 72 onto the external data bus (data signals DQ[35:0]), is variably programmable to values of 1 to 4.5 periods of the CLK signal. The extra half-period latency of the CLK signal needed to propagate the data from the output buffers 74 to the data signals DQ[35:0] is attributable to the buffer enable register 76. It can be understood by those skilled in the art that the number of clock latency periods may be varied by varying the size of the leadoff multiplexer 60 and the number of flip flops that constitute the serial register 44.

The latency period of the number of clocks to latch the data in the output registers 68 given the eight combinations of lead-off signals is summarized in Table 1.

TABLE 1

Number of Clocks for Access Given a Lead Off Pin Programming Value

| LEAD_OFF_2 | LEAD_OFF_1 | LEAD_OFF_0 | #CLOCKS FOR ACCESS |
|---|---|---|---|
| 0 | 0 | 0 | 0.5 |
| 0 | 0 | 1 | 1.0 – |
| 0 | 1 | 0 | 1.5 |
| 0 | 1 | 1 | 2.0 |
| 1 | 0 | 0 | 2.5 |
| 1 | 0 | 1 | 3.0 |
| 1 | 1 | 0 | 3.5 |
| 1 | 1 | 1 | 4.0 |

It can be understood by those skilled in the art that the clocking scheme of the present invention may be modified. For example, instead of the clock generation circuit 36, the present invention could incorporate flip flops and registers that are clocked on both the rising edge and the falling edge of the signal CLK. The data could thus be read out of the memory circuit 16 at twice the frequency of the signal CLK.

FIG. 3 is a timing diagram that illustrates signals of the memory circuit 16 of FIG. 1. The LEAD_OFF_0 signal is set to a logic low value, the LEAD_OFF_1 signal is set to a logic high value, and the LEAD_OFF_2 signal is set to a logic low value. These settings correspond to a 1.5 clock period latency from the time the address is presented to the memory circuit to the time the data is latched into the output registers 68. This corresponds to a 2 clock period latency of the CLK signal from the time the address is presented to the memory circuit 16 to the time the data appears on the external data bus lines DQ[35:0]. The EE signal is set to a logic low value, and thus data may be delivered to the output once every period of the CLK signal. As can be seen in FIG. 3, the READ signal becomes active shortly after time to. The READ signal becomes active after the R/W# and CE signals are at a logic high value, the CE#, CE2#, and ADS# signals are at a logic low value, and the CLK signal transitions to a logic high value and latches a logic high value into the read register 26. The READ signal is active after the logic high value is latched into the read register 26 due to the delay introduced by the buffers 32 and 34. Because in the particular implementation depicted in FIG. 3 the desired latency is 1.5 clock periods, the LEADOFF MUX signal becomes active (between $t_5$ and $t_6$) shortly after the READ signal is latched into the flip flop 48, represented as signal Q1 in FIG. 3. Shortly after the LEADOFF MUX signal becomes active, the output register 68 is enabled, as represented by signal OUTPUT REG E in FIG. 3. The output data is latched between $t_7$ and $t_8$, when the 2XCLK signal transitions high, shortly after the 1.5 clock period of the CLK signal. The time of the latching of the data is represented in FIG. 3 as OUTPUT DATA REGISTERED. The LEADOFF MUX signal is latched into the buffer enable register 76 on the same transition of the 2XCLK signal. The buffer enable register 76 output terminal, Q8, transitions to an active state and enables the output buffers 74. The data is thus present on the data bus as shown in FIG. 3 as OUTPUT DATA, such that the data is available on the second period transition of the CLK signal.

Because the EE signal is set to a logic low value, the every edge register 64 is enabled. Thus, on the transition of the 2XCLK signal following the transition of the LEADOFF MUX signal, the logic high state of the LEADOFF MUX signal is latched into the every edge register 64 and is available at its output, as represented by Q7 in FIG. 3. When Q7 transitions to the active state, the output register enable signal, OUTPUT REG E in FIG. 3, transitions to a logic low value because the negative input of the AND gate 66 is presented with a logic high value from the Q7 terminal of the every edge register 64. The logic low value from the output of AND gate 66 is latched into the every edge register 64 on the transition of the 2XCLK shortly after $t_{10}$. The output terminal Q7 of the every edge register 64 subsequently assumes a logic low value, which is input into the negative input of the AND gate 66. The output of the AND gate 66 transitions to a logic high value and thus the output register is enabled, as represented by the OUTPUT REG E signal in FIG. 3.

FIG. 4 is a timing diagram that illustrates signals of the memory circuit 16 of FIG. 1. The LEAD_OFF_0 signal is set to a logic high value, the LEAD_OFF_1 signal is set to a logic low value, and the LEAD_OFF_2 signal is set to a logic low value. These settings correspond to a 1.0 clock period latency from the time the address is presented to the memory circuit 16 to the time the data is latched into the output registers 68. This corresponds to a 1.5 clock period latency from the time the address is presented to the memory circuit 16 to the time the data appears on the output data bus signals DQ[35:0]. The EE signal is set to a logic high value, and thus the data is delivered to the output twice every period of the CLK signal.

As can be seen in FIG. 4, the READ signal becomes active shortly after time $t_0$. Because in the particular implementation depicted in FIG. 4 the desired latency is 1 clock period, the LEADOFF MUX signal becomes active (between $t_3$ and $t_4$) shortly after the READ signal is latched into the flip flop 46, represented as signal Q0 in FIG. 4. Shortly after the LEADOFF MUX signal becomes active, the output register 68 is enabled, as represented by signal OUTPUT REG E in FIG. 4. The output data is registered between $t_5$ and $t_6$, when the 2XCLK signal transitions high, shortly after the 1 clock period of the CLK signal. The time of the latching of the data is represented in FIG. 4 as OUTPUT DATA REGISTERED. The LEADOFF MUX signal is latched into the buffer enable register 76 on the same transition of the 2XCLK signal. The buffer enable register 76 output terminal, Q8, transitions to an active state and enables the output buffers 74. The data is thus present on the data bus as shown in FIG. 4 as OUTPUT DATA, such that the data is available on the 1.5 period transition of the CLK signal.

Because the EE signal is set to a logic high value, the every edge register 64 is disabled and the inverted input of the AND gate 66 is at a logic high value. Thus, the output of the AND gate 66, as represented in FIG. 4 as OUTPUT REG E, follows the value of the LEADOFF MUX signal. Because the output registers 68 are enabled during the time the LEADOFF MUX signal is at a logic high value, data from the output buffers 74 are latched into the output registers 68 at every rising transition of the 2XCLK signal. Data is then available at the output at every one-half clock period of the CLK signal.

The present invention also contemplates a method for controlling the read latency time of a memory circuit. The method, in its broadest form, is comprised of the steps of delaying a read enable signal to produce a plurality of values derived from the read enable signal and selecting one of the plurality of values in response to at least one control signal. Each of the plurality of values is representative of the read enable signal delayed by a predetermined period of time. The selected value is used to enable a read operation of the memory circuit.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A memory circuit, comprising:

a memory array;

write control and addressing logic connected to said memory array;

sense amplifiers connected to said memory array;

output registers connected to said sense amplifiers;

a plurality of output buffers connected to said output registers; and read output control logic responsive to a plurality of control signals for controlling a frequency of enablement of said output registers, wherein said read output control logic includes:

a delay circuit for producing a plurality of values of a read enable signal, each value delayed a predetermined period of time;

a multiplexer for selecting one of said plurality of values in response to at least one control signal, said selected value being input to said output registers; and a buffer enable register connected between said multiplexer and said plurality of output buffers.

2. The memory circuit of claim 1 wherein said read output control logic includes an every-edge register and a gate, said gate having a first input terminal connected to said every-edge register and a second input terminal connected to said multiplexer and an output terminal connected to an enable terminal of said output registers.

3. The memory circuit of claim 2 wherein said read output control logic includes a clock circuit for producing a clock signal, said clock signal being input to said buffer enable register, said output registers, and said every-edge register.

4. The memory circuit of claim 3 wherein said delay circuit includes a plurality of series connected flip-flops clocked by said clock signal.

5. The memory circuit of claim 1, wherein:

said multiplexer includes a first plurality of input terminals and a second plurality of input terminals, wherein said first plurality of input terminals are connected to a control line; and said delay circuit includes a plurality of series-connected flip-flops, wherein each of said flip-flops forming said delay circuit includes an output terminal connected to one of said second plurality of input terminals of said multiplexer.

6. The memory circuit of claim 5, wherein said multiplexer includes a plurality of logic gates, each logic gate having a first input terminal connected to a control line and a second input terminal connected to said output terminal of one of said plurality of flip-flops.

7. The memory circuit of claim 6, wherein one of said plurality of flip-flops of said delay circuit includes an input terminal connected to an output terminal of a read enable signal generation circuit.

8. The memory circuit of claim 1, wherein said read output control logic includes a clock signal generation circuit, said clock signal generation circuit including a buffer having an input terminal connected to a clock line and a logic circuit having a first input terminal connected to an output terminal of said buffer and a second input terminal connected to said clock line.

9. The memory circuit of claim 1, wherein:

the delay circuit includes a plurality of series-connected flip-flops, each of said flip-flops having a clock terminal connected to an output terminal of said logic circuit of said clock signal generation circuit; and the multiplexer includes a plurality of logic gates, each of said logic gates having a first input terminal connected to a control line and a second input terminal connected to an output terminal of one of said flip-flops.

10. A system, comprising:

a controlling device; and a memory circuit in communication with said controlling device, said memory circuit including:
a memory array;
write control and addressing logic connected to said memory array;
sense amplifiers connected to said memory array;
output registers connected to said sense amplifiers;
a plurality of output buffers connected to said output registers; and
read output control logic responsive to a plurality of control signals for controlling a frequency of enablement of said output registers wherein said read control logic circuit includes:
a delay circuit for producing a plurality of values of a read enable signal, each value delayed a predetermined period of time;
a multiplexer for selecting one of said plurality of values in response to at least one control signal, said selected value being input to said output registers; and
a buffer enable register connected between said multiplexer and said plurality of output buffers.

11. The system of claim 10 wherein said controlling device is a microprocessor.

12. The system of claim 10 wherein said controlling device is an application specific integrated circuit.

13. A memory circuit, comprising:

a memory array;

write control and addressing logic connected to said memory array;

a sense amplifier connected to said memory array;

an output register connected to said sense amplifier and having a control input terminal;

an output buffer connected to said output register;

a delay circuit clocked with a clock signal that is twice a frequency of an externally supplied clock signal for producing a plurality of values of a read enable signal, each value delayed by a predetermined period of time;

a multiplexer connected to said delay circuit for selecting one of said plurality of values in response to at least one control signal, said multiplexer having an output terminal connected to said control input terminal of said output register; and a buffer enable register having an input terminal connected to said output terminal of said multiplexer and an output terminal connected to a control terminal of said output buffer.

14. The memory circuit of claim 13, wherein said buffer enable register and said output register are responsive to said clock signal that is twice the frequency of said externally supplied clock signal.

15. The memory circuit of claim 14, further comprising:

an every-edge register having an output terminal; and a logic gate having a first input terminal connected to said output terminal of said every-edge register, a second input terminal connected to said output terminal of said multiplexer, and an output terminal connected to said control input terminal of said output register.

16. The memory circuit of claim 15, wherein said every-edge register is responsive to said clock signal that is twice the frequency of said externally supplied clock signal.

17. The memory circuit of claim 13, wherein:

said multiplexer includes a first plurality of input terminals connected to a control line; and said delay circuit includes a plurality of series-connected flip-flops, wherein each of said flip-flops forming said delay circuit includes an output terminal connected to one of a second plurality of input terminals of said multiplexer.

18. A system, comprising:

a controlling device; and a memory circuit in communication with said controlling device, said memory circuit including:
a memory array;
write control and addressing logic connected to said memory array;
a sense amplifier connected to said memory array;
an output register connected to said sense amplifier;
an output buffer connected to said output register;
a delay circuit clocked with a clock signal that is twice a frequency of an externally supplied clock signal for producing a plurality of values of a read enable signal, each value of the read enable signal delayed by a predetermined period of time;
a multiplexer connected to said delay circuit for selecting one of said plurality of values in response to at least one control signal, said multiplexer having an output terminal connected to a control input terminal of said output register; and
a buffer enable register having an input terminal connected to said output terminal of said multiplexer and an output terminal connected to a control input terminal of said output buffer.

19. The memory system of claim 18, wherein said controlling device is a microprocessor.

20. The memory system of claim 19, wherein said controlling device is a application specific integrated circuit.

* * * * *

UNITED STATES PATENT AND TRADEMARK OFFICE
CERTIFICATE OF CORRECTION

PATENT NO.    : 6,031,770
DATED         : February 29, 2000
INVENTOR(S)   : Pawlowski It is certified that error appears in the above-identified patent and that said Letters Patent is hereby corrected as shown below:

Column 1,
Line 37, after "this", insert -- goal --.

Column 3,
Line 14, after "the," insert -- present --.

Column 5,
Line 47, after "identical", delete "Lo" and replace therewith -- to --.

Column 6,
Line 36, after "of the", delete "LFAD" and replace therewith -- LEAD --.

Column 8,
Line 46, after "time", delete "to" and replace therewith -- $t^o$ --.

Signed and Sealed this

Twenty-fifth Day of May, 2004

JON W. DUDAS
*Acting Director of the United States Patent and Trademark Office*